(12) United States Patent
Ishii

(10) Patent No.: US 7,167,031 B2
(45) Date of Patent: Jan. 23, 2007

(54) SYNCHRONIZING CIRCUIT PROVIDED WITH HYSTERESIS PHASE COMPARATOR

(75) Inventor: Hirotomo Ishii, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 63 days.

(21) Appl. No.: 10/746,454

(22) Filed: Dec. 24, 2003

(65) Prior Publication Data
US 2004/0135642 A1 Jul. 15, 2004

(30) Foreign Application Priority Data
Dec. 25, 2002 (JP) ............... 2002-374709

(51) Int. Cl.
*H03L 7/06* (2006.01)
(52) U.S. Cl. ............ 327/149; 327/3; 327/151; 331/25
(58) Field of Classification Search .......... 331/16, 331/17, 25, 1 A; 327/3, 5, 7–10, 12, 141–151, 327/156–160; 375/376
See application file for complete search history.

(56) References Cited

U.S. PATENT DOCUMENTS 3,217,267 A * 11/1965 Loposer .............. 331/16
4,612,515 A    9/1986 Ohkawa et al. .......... 331/14
4,970,475 A * 11/1990 Gillig ..................... 331/25
5,699,387 A * 12/1997 Seto et al. .............. 375/376
6,049,233 A *  4/2000 Shurboff ................. 327/2
6,771,096 B1 *  8/2004 Meyers et al. ........... 327/3

OTHER PUBLICATIONS

Donald G. Troha, "Digital Phase-Locked Loop Design Using SN54/74LS297," Texas Instruments, pp. 1-15, Mar. 1997.

* cited by examiner

*Primary Examiner*—Timothy P. Callahan
*Assistant Examiner*—William Hernandez
(74) *Attorney, Agent, or Firm*—DLA Piper US LLP

(57) ABSTRACT

A synchronizing circuit includes a phase comparator having hysteresis characteristics and a dead zone, and configured to generate a frequency division ratio control signal based on a phase difference between a first clock and a second clock. The circuit further includes a variable frequency divider configured to generate a fourth clock by subjecting a third clock to frequency division at a frequency division ratio set in accordance with the frequency division ratio control signal, and a clock generator configured to subject the fourth clock supplied from the variable frequency divider to frequency division at a predetermined frequency division ratio, and generate the second clock such that the second clock synchronizes with transfer data which is supplied from an outside of the synchronizing circuit.

15 Claims, 9 Drawing Sheets

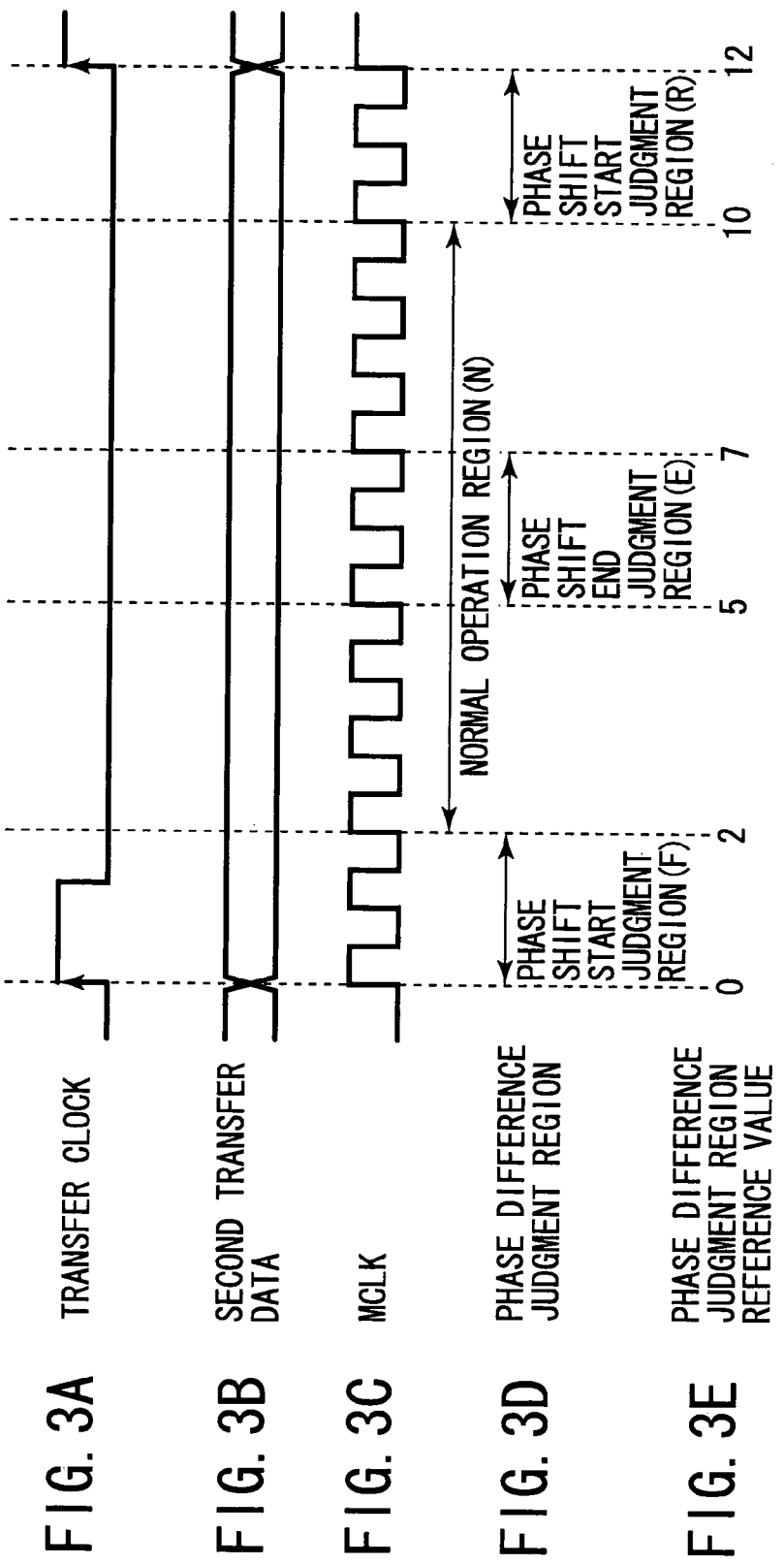

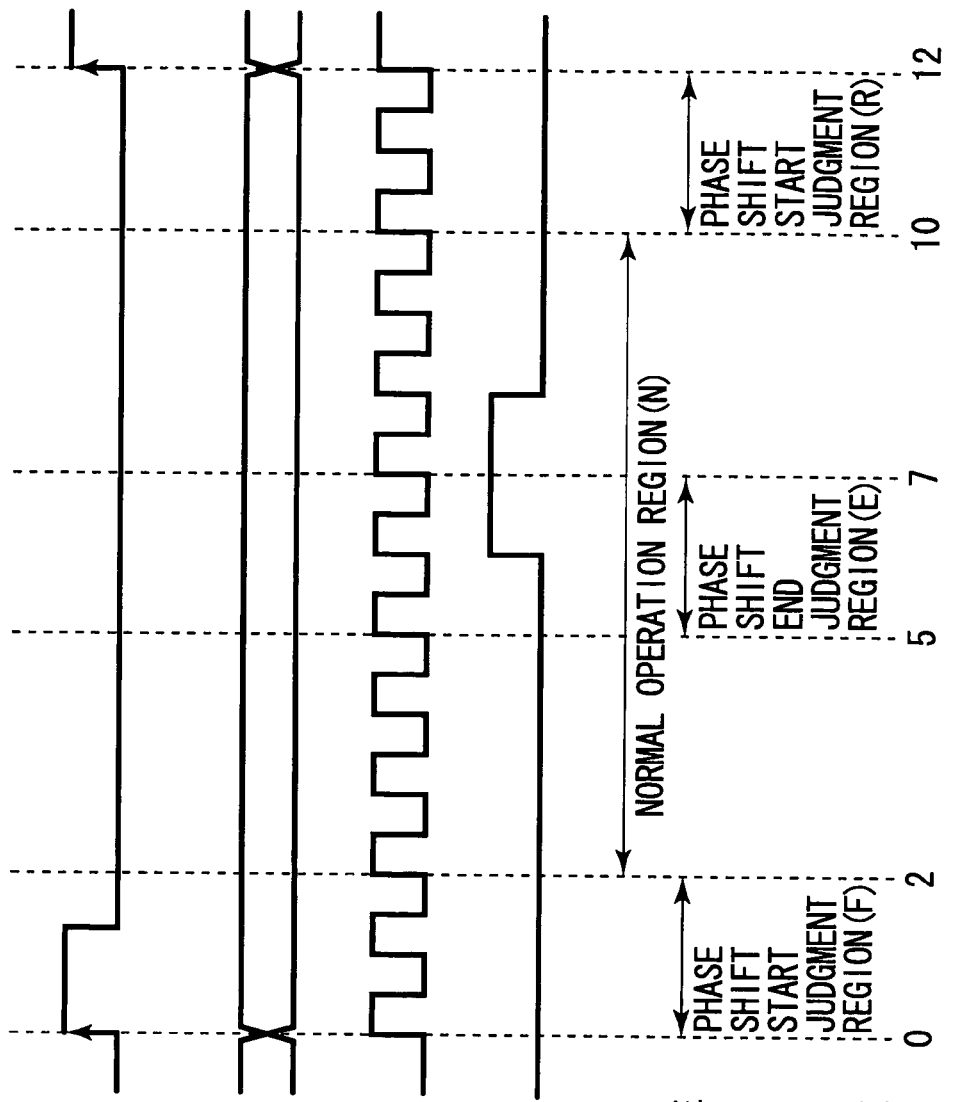

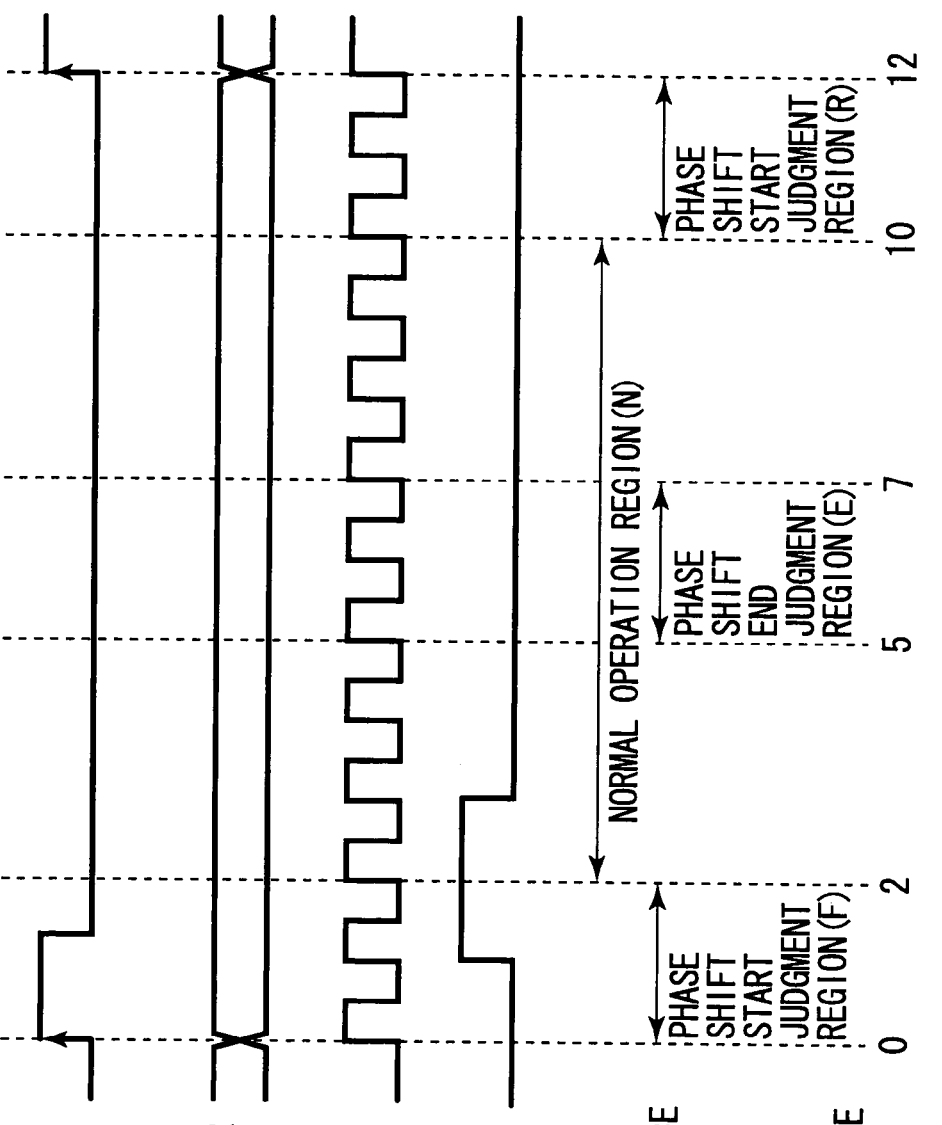

FIG. 12A (PRIOR ART) TRANSFER CLOCK

FIG. 12B (PRIOR ART) SECOND TRANSFER DATA

FIG. 12C (PRIOR ART) I/F CLOCK

FIG. 12D (PRIOR ART) RECEPTION DATA

SYNCHRONIZING CIRCUIT PROVIDED WITH HYSTERESIS PHASE COMPARATOR

CROSS-REFERENCE TO RELATED APPLICATIONS

This application is based upon and claims the benefit of priority from the prior Japanese Patent Application No. 2002-374709, filed Dec. 25, 2002, the entire contents of which are incorporated herein by reference.

BACKGROUND OF THE INVENTION

1. Field of the Invention

The present invention relates to a synchronizing circuit including a hysteresis phase comparator, more particularly, a PLL (Phase Locked Loop) circuit for generating a clock signal adapted for a system provided with a CODEC (Coder & Decoder) for a voice signal or an audio signal.

2. Description of the Related Art

When data is transmitted with a digital signal from a transmitting side to a receiving side, it is required that the data is correctly received by the receiving side, i.e., the data does not lack a data piece, or it does not contain duplicate data pieces. Furthermore, in a system wherein the received data is finally converted into an analog signal, it is also needed to sufficiently reduce the jitter of a clock on the receiving side which synchronizes with the received data. This need further increases, especially for a system incorporating an audio CODEC or a voice CODEC which handles a voice signal or an audio signal. This is because such a system uses the clock on the receiving side as a sampling clock for an AD converter (ADC) or a DA converter (DAC). That is, when jitter occurs in the clock of the receiving side, the S/N ratio (signal-to-noise ratio) of the ADC or DAC lowers. In general, it is required that the jitter of a clock to be obtained is reduced as the resolution of the ADC or DAC increases.

FIG. 8 shows an example of the structure of a conventional system including a CODEC. The conventional system comprises a signal processing section 10 and a CODEC section 20. The signal processing section 10 processes a digital signal, etc. The CODEC section 20 has a function of converting an analog input signal into a digital signal (first transfer data) and a function of converting a digital signal (second transfer data) output from the signal processing section 10 into an analog output signal. Such a system is used in transmission and reception of voice, etc. by a mobile telephone.

As shown in FIG. 8, the second transfer data is transferred from the signal processing section 10 to the CODEC section 20, and the first transfer data is transferred from the CODEC section 20 to the signal processing section 10. Also, a transfer clock (reference signal) which synchronizes with the first and second transfer data is supplied from the signal processing section 10 to the CODEC section 20.

The CODEC section 20 comprises an I/F (interface) section 21, a CODEC 22 and an analog PLL 23. The analog PLL 23 fetches the transfer clock from the signal processing section 10. The analog PLL 23 generates an I/F clock synchronizing with the transfer clock, and outputs the I/F clock to the I/F section 21. Further, the analog PLL 23 generates a sampling clock having a frequency which is a rational number of times greater than that of the transfer clock, and outputs the sampling clock to the CODEC 22.

The I/F section 21 receives the second transfer data from the signal processing section 10, while synchronizing the second transfer data with the I/F clock from the analog PLL 23. Then, the I/F section 21 generates a reception signal (digital signal) in accordance with the second transfer data, and outputs the reception signal to the CODEC 22. Further, the I/F section 21 receives transmission data (digital signal) from the CODEC 22, while synchronizing the transmission data with the I/F clock from the analog PLL 23. The I/F section 21 then generates the first transfer data in accordance with the transmitted data, and outputs the first transfer data to the signal processing section 10.

The CODEC 22 comprises a digital signal processing circuit and an ADC and DAC. The CODEC 22 converts the reception data from the I/F section 21 into an analog output signal by using the sampling clock from the analog PLL 23.

In such a manner, in the conventional system shown in FIG. 8, A/D conversion is performed by the ADC, or D/A conversion is performed by the DAC, in addition to transmission and reception of data, based on the I/F clock and sampling clock which are generated by the analog PLL 23. Therefore, the characteristics of the analog PLL 23 greatly influence those of the system.

FIG. 9 shows an example of the structure of the analog PLL 23 shown in FIG. 8. The analog PLL 23 comprises a phase comparator 23a, a loop filter 23b, a VCO (Voltage Controlled Oscillator) 23c and a frequency divider 23d. The phase comparator 23a generates a signal in accordance with the phase difference between the I/F clock and the transfer clock from the signal processing section 10, and then supplies the signal to the loop filter 23b. The loop filter 23b smoothens the signal supplied from the phase comparator 23a, and then supplies the signal to the VCO 23c. The VCO 23c generates a signal having a frequency which is determined in accordance with the signal supplied from the loop filter 23b. The signal generated by the VCO 23c is subjected to frequency division by the frequency divider 23d (i.e., its frequency is divided by the frequency divider 23d). The signal subjected to frequency division is then supplied as the I/F clock to the I/F section 21 and the phase comparator 23a. In such a manner, regularly, the analog PLL 23 operates to equalize the transfer clock and the I/F clock, and also to make the phase difference therebetween constant.

FIG. 10 shows another example of the structure of the conventional system including the CODEC. In this example, the system has the same elements as the system shown in FIG. 8, with the exception of the following: the analog PLL 23 is replaced by a digital PLL 23A to which a master clock (MCLK) is input (see, e.g., Troha, James, D. "Digital Phase-Locked Loop Design using SN54/74LS297", Texas Instruments Application Note, http://www-s.ti.com/sc/psheets/sdla005b/sdla005b.pdf, 1997, which discloses an example of the digital PLL).

The MCLK is a clock signal generated within a CODEC section 20' or a clock signal supplied from the outside of the CODEC section 20'. The frequency of the MCLK is an integer number of times greater than the average frequency of the I/F clock.

FIG. 11 shows an example of the structure of the digital PLL 23A shown in FIG. 10. The digital PLL 23A comprises a phase comparator 23a, a frequency divider 23d, a digital loop filter 23e and a variable frequency divider 23f. In the digital PLL 23A, the digital loop filter 23e and the variable frequency divider 23f are used, instead of the loop filter 23b and VOC 23c of the analog PLL 23, respectively. To be more specific, the digital loop filter 23e is a digital filter which operates in accordance with the MCLK. The digital loop filter 23e smoothens the output signal of the phase comparator 23a by using the MCLK, and then supplies the signal to the variable frequency divider 23f. The digital loop filter 23e corresponds to the loop filter 23b of the analog PLL 23. The variable frequency divider 23f is a frequency divider the frequency division ratio of which varies in accordance with the output signal of the digital loop filter 23e. More specifically, the variable frequency divider 23f divides the frequency of the MCLK at the frequency division ratio which is controlled by the digital loop filter 23e, and generates a sampling clock. The variable frequency divider 23f then outputs the sampling clock to the frequency divider 23d and the CODEC 22. The variable frequency divider 23f corresponds to the VCO 23c of the analog PLL 23. As can be seen from the above, the digital PLL 23A is substantially equivalent to the analog PLL 23.

As explained above, with respect to the system provided with the CODEC, the system using the digital PLL 23A is substantially equivalent to that using the analog PLL 23. Accordingly, with respect to those systems, the following explanation is given by referring to only the system using the analog PLL 23 shown in FIG. 8 and the analog PLL 23 in FIG. 9. Needless to say, even if they are replaced by the system using the digital PLL 23A shown in FIG. 10 and the digital PLL 23A in FIG. 11, the same explanation can be applied.

FIGS. 12A to 12D show examples of the waveforms of signals used in the system shown in FIG. 8. To be more specific, FIGS. 12A, 12B, 12C and 12D disclose the transfer clock, the second transfer data, the I/F clock and the reception data, respectively. The signal level of the second transfer data varies in synchronism with the rising edge of the transfer clock. The rising edge of the I/F clock is synchronized with the falling edge of the transfer clock by the analog PLL 23. It is shown in the above figures that the period from time t3 to time t4 of the transfer clock is longer than any of the other periods thereof. The I/F clock varies while following the transfer clock in period, and the period from time t3i to t4i of the I/F clock is longer than any of the other periods thereof. In such a manner, the system in FIG. 8 generates an I/F clock, which varies while following variation of the transfer clock with respect to period, by using the analog PLL 23, thereby achieving reliable data transfer.

As explained above, in the system in FIG. 8, the periods of the I/F clock are not constant. This means that the transfer clock has jitter, and the I/F clock thus also has jitter. This means that jitter also occurs in a sampling clock having a frequency which is a rational number of times greater than that of the transfer clock. Accordingly, as stated above, the S/N ratio of the ADC or DAC of the CODEC 22 lowers.

FIG. 13 shows a relationship between the phase difference between two signals (the transfer clock and I/F clock) input to the phase comparator 23a of the analog PLL 23 (which is referred to as an input signal phase difference in the figure) and the variation of the frequency of the output signal from the analog PLL 23 (which is referred to as an output frequency variation in the figure). As shown in FIG. 13, the analog PLL 23 is designed such that the output signal frequency increases in a monotonically increasing manner as the phase difference between the signals input to the phase comparator 23a increases. If the frequency of the output signal does not vary when the phase difference between the input signals is within a certain range, the range is referred to as a dead zone. Referring to FIG. 13, when the variation of the frequency of the output signal is "0", the phase difference between the input signals is also "0". However, generally, the above phenomenon is not limited to the case where the phase difference is "0" when the frequency variation is "0". That is, generally, in this case the phase difference is not necessarily "0", and it is constant.

As is clear from FIG. 13, one of the features of a conventional PLL circuit resides in that the greater the phase difference between the input signals, the greater the variation of the frequency of the output signal. When this is explained with respect to the system in FIG. 8, it can be said that the frequency variation of each of the I/F clock and the sampling clock increases as the variation of the phase of the transfer clock increases. In other words, jitter occurs in the I/F clock and the sampling clock when the level of the jitter of the transfer clock increases. That is, it can be considered that use of the conventional analog PLL 23 easily causes lowering of the S/N ratio of the CODEC 22.

The total characteristics of the analog PLL 23 also depend on transient response characteristics thereof. FIGS. 14 and 15 show examples of the transient response characteristics when the output frequency of the analog PLL 23 changes from f1 to f2. FIG. 14 shows a case where a lock-up time is short, but relatively large overshoot and undershoot (ringing) occur. FIG. 15 shows a case where the overshoot is small, but the lock-up time is long. Also, it should be noted that suppose the lock-up time is a time period required until the output frequency falls within an allowable error range as shown in, e.g., FIGS. 14 and 15. It is known that the total characteristics of the analog PLL23 depend on conversion characteristics of the phase comparator 23a, characteristics of the oscillation frequency of the VCO 23c to a control signal and characteristics of the loop filter 23.

Generally, as shown in FIGS. 14 and 15, when the lock-up time is short, overshoot or undershoot easily occurs. On the other hand, when the overshoot or undershoot is small, the lock-up time tends to be long.

FIGS. 16A to 16C show examples of the frequency variation of the transfer clock, and examples of the frequency variation of the I/F clock to that of the transfer clock. FIG. 16A is an example of the frequency variation of the transfer clock. "EXAMPLE 1 OF FREQUENCY VARIATION OF I/F CLOCK" in FIG. 16B is an example of the case where an analog PLL having such transient response characteristics as shown in FIG. 14 is used as the analog PLL 23. "EXAMPLE 2 OF FREQUENCY VARIATION OF I/F CLOCK" in FIG. 16C is an example of the case where an analog PLL having such transient response characteristics as shown in FIG. 15 is used as the analog PLL 23.

In "EXAMPLE 2 OF FREQUENCY VARIATION OF I/F CLOCK" in FIG. 16C, the frequency does not steeply or minutely vary, and the frequency variation is relatively smooth, as compared with "EXAMPLE 1 OF FREQUENCY VARIATION OF I/F CLOCK" in FIG. 16B. However, EXAMPLE 1 and EXAMPLE 2 have both the same problem. That is, in EXAMPLE 1 and EXAMPLE 2, the frequency of the I/F clock varies while following variation of the frequency of the transfer clock.

In the system in FIG. 8, it is preferable that the lock-up time be short, in order to ensure reliable data transfer. Thus, as the analog PLL 23, the analog PLL having such transient response characteristics as shown in FIG. 14 is more suitable than the analog PLL having such transient response characteristics as shown in FIG. 15. However, when the analog PLL having transient response characteristics shown in FIG. 14 is used as the analog PLL 23, the output frequency easily shows minute variation due to overshoot and undershoot as shown in FIG. 16B. Even if the frequency of the transfer clock varies by such a slight amount as not to affect the data transfer, the frequency of the analog output signal varies inevitably.

In such a manner, there is a case where as the function (characteristics) of the PLL circuit varies, the jitter increases, and the S/N ratio of the CODEC further lowers.

As explained above, in the above conventional method, the I/F clock reliably follows the transfer track, thus achieving reliable data transfer. However, when the conventional method is applied to a system provided with a voice CODEC or an audio CODEC, the S/N ratio lowers.

It should be noted that there is a method which can satisfy both the above two requirements in which reliable data transfer is achieved, and the S/N ratio is not lowered. However, if the method is applied, the circuit is complicated, as compared with the case where the above conventional method is applied. It is thus also inappropriate.

Namely, it is required to reduce the size of the circuit and the power consumption as much as possible, and provide a system which satisfies the above requirements and can be easily achieved.

BRIEF SUMMARY OF THE INVENTION

According to a first aspect of the present invention, there is provided a synchronizing circuit which comprising: a phase comparator having hysteresis characteristics and a dead zone, and configured to generate a frequency division ratio control signal based on a phase difference between a first clock and a second clock; a variable frequency divider configured to generate a fourth clock by subjecting a third clock to frequency division at a frequency division ratio set in accordance with the frequency division ratio control signal; and a clock generator configured to subject the fourth clock supplied from the variable frequency divider to frequency division at a predetermined frequency division ratio, and generate the second clock such that the second clock synchronizes with transfer data which is supplied from an outside of the synchronizing circuit.

BRIEF DESCRIPTION OF THE SEVERAL VIEWS OF THE DRAWING

FIGS. 3A to 3E are timing charts for use in explaining an example of the operation of the hysteresis phase comparator.

FIGS. 4A to 4F are timing charts for use in explaining a case where in the operation of the hysteresis phase comparator, the rising edge of an I/F clock is within a phase shift end judgment region (E).

FIGS. 5A to 5F are timing charts for use in explaining a case where in the operation of the hysteresis phase comparator, the rising edge of the I/F clock is within a phase shift start judgment region (F).

DETAILED DESCRIPTION OF THE INVENTION

An embodiment of the present invention will be explained with reference to the accompanying drawings.

Figure 1:
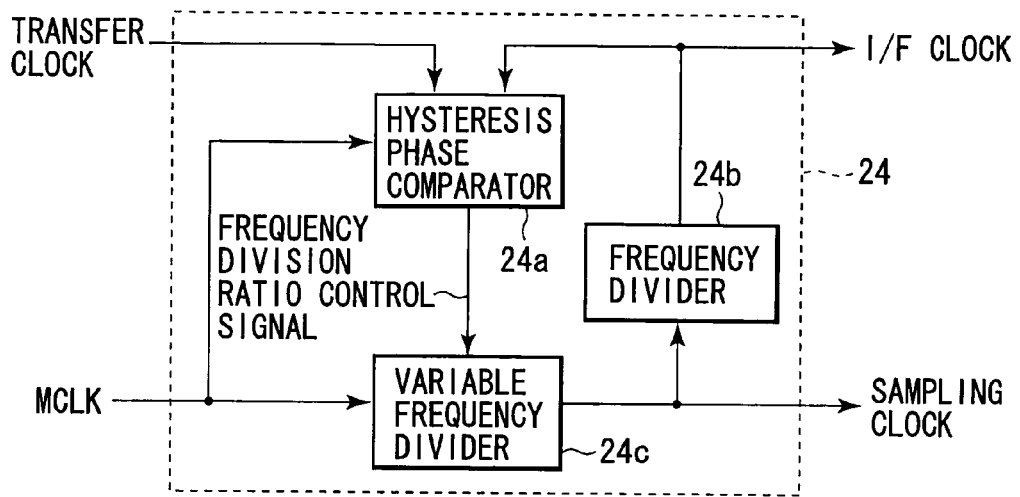
FIG. 1 is a block diagram of an example of the structure of a digital PLL according to an embodiment of the present invention.
Figure 8:
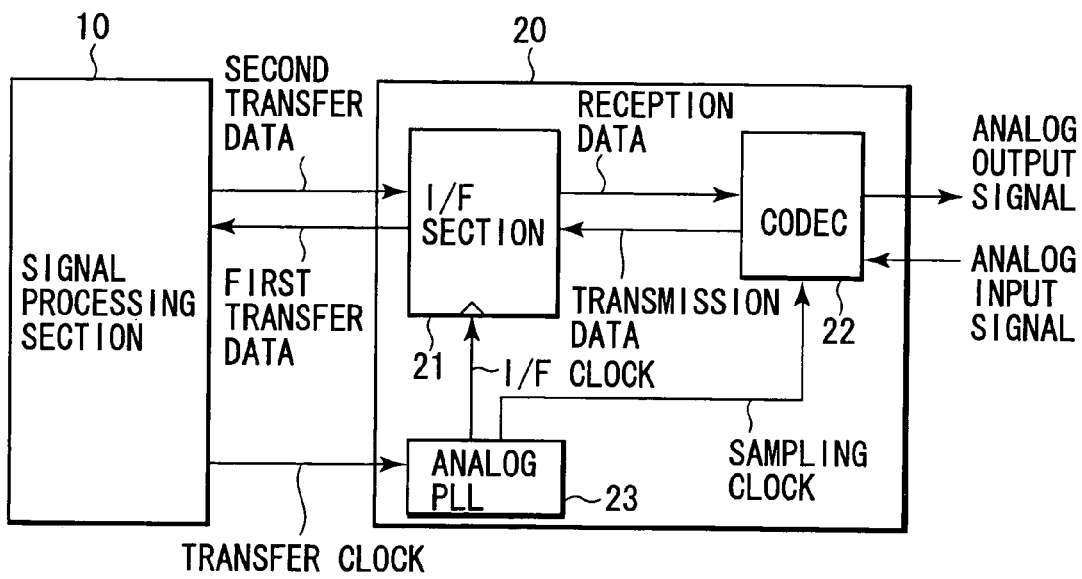
FIG. 8 is a block diagram of an example of a conventional system provided with a CODEC, to which a conventional analog PLL is applied, and is used in explaining the prior art and the problem thereof.
Figure 9:
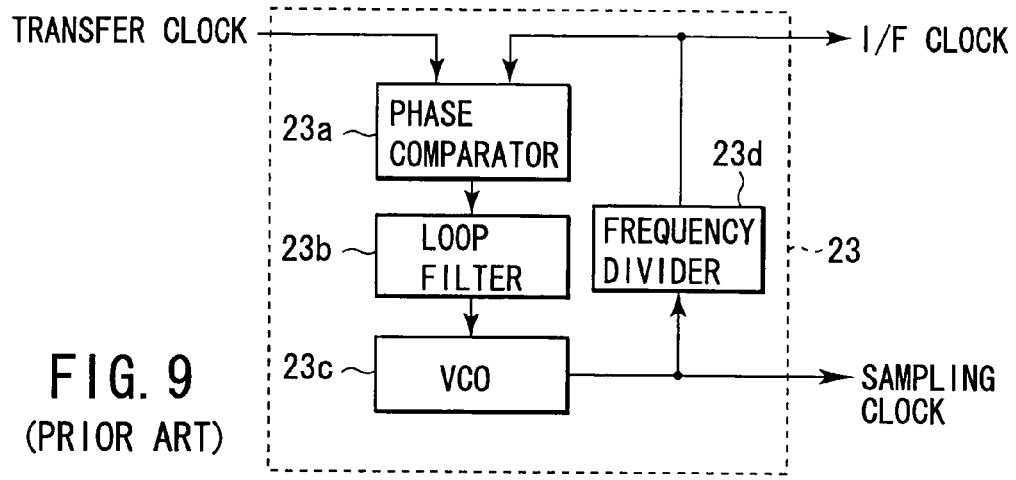
FIG. 9 is a block diagram of an example of the structure of the conventional analog PLL in FIG. 8.
Figure 10:
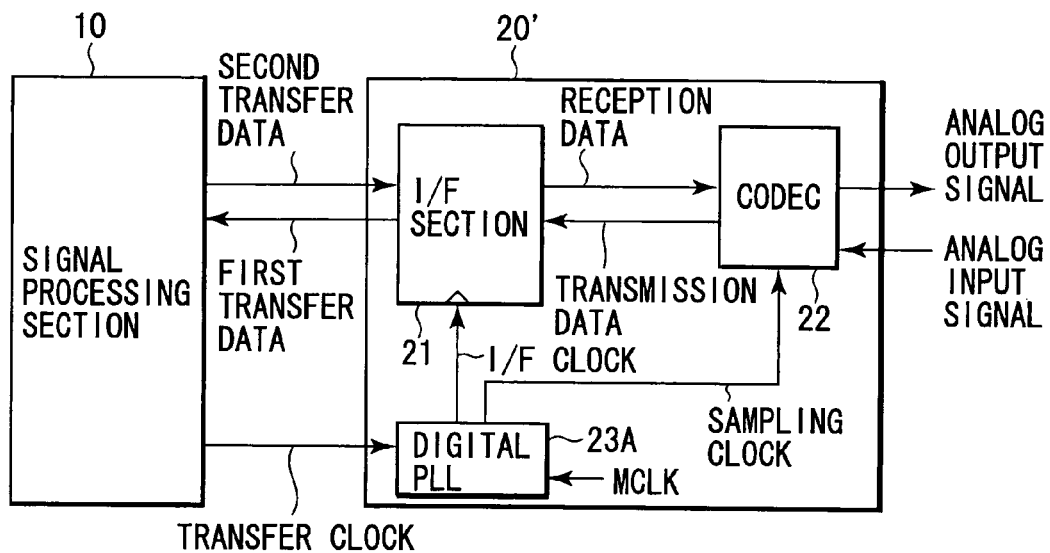
FIG. 10 is a block diagram of an example of the conventional system provided with the CODEC, to which a conventional digital PLL is applied.
Figure 11:
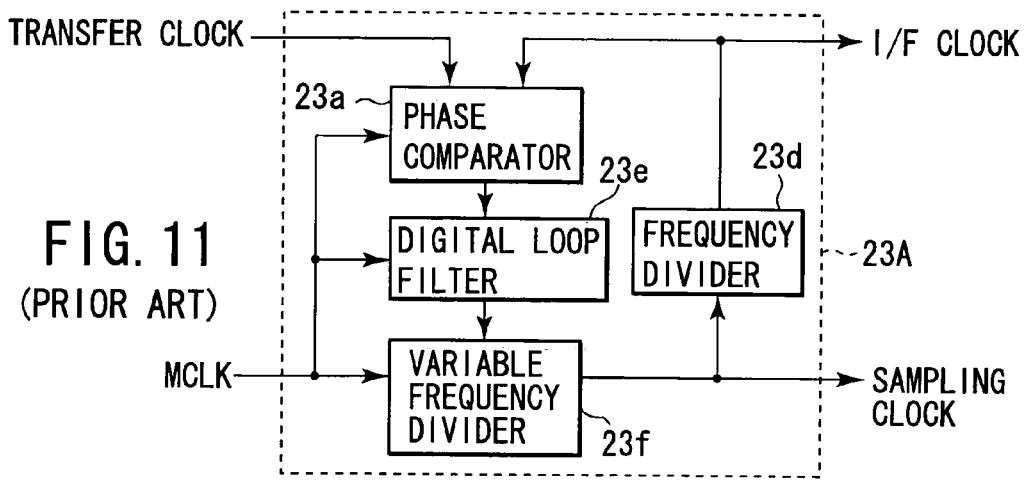
FIG. 11 is a block diagram of an example of the structure of the conventional digital PLL in FIG. 10.
Figure 12:
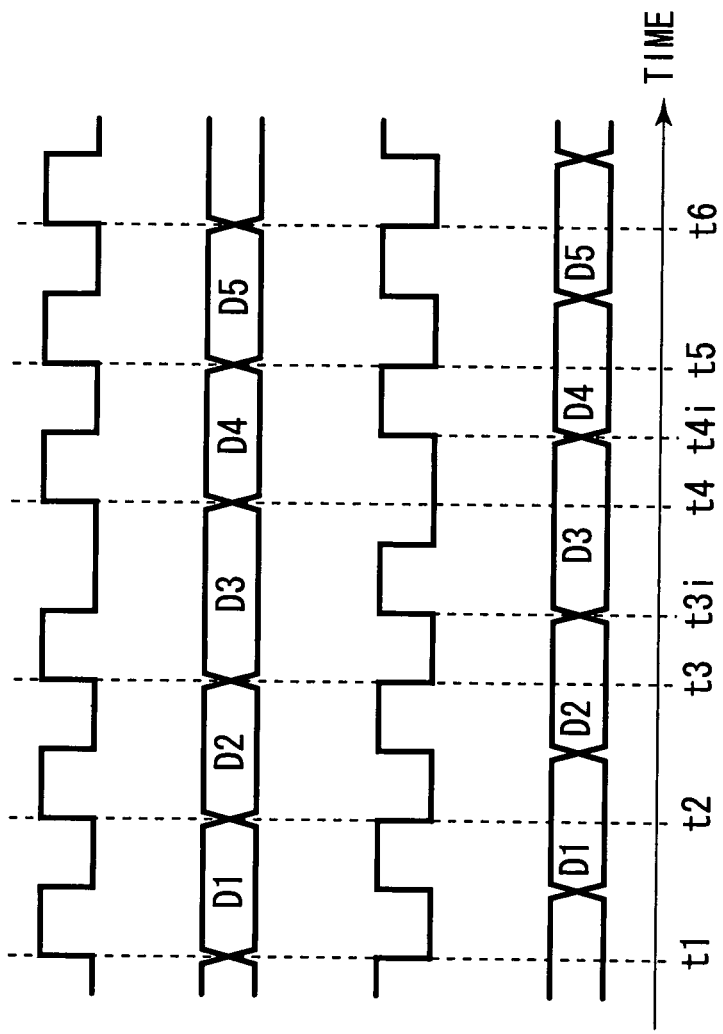
FIGS. 12A to 12D are timing charts for use in explaining the operation of the example of the system in FIG. 8.

FIG. 1 shows an example of the structure of a synchronizing circuit according to the embodiment of the present invention. The following explanation is given with respect to a case where in a digital PLL (see, e.g., FIG. 9) which is to be applied to the system shown in FIG. 8 which includes the CODEC, the phase comparator is replaced by a hysteresis phase comparator which has hysteresis characteristics and a relatively large dead zone.

As shown in FIG. 1, according to the embodiment of the present invention, a digital PLL 24 comprises a hysteresis comparator 24a, a frequency divider (clock generator) 24b and a variable frequency divider 24c. The digital PLL 24 receives a MCLK (third clock) and a transfer clock (first clock), and outputs an I/F clock (second clock) and a sampling clock (fourth clock). The hysteresis comparator 24a receives the transfer clock, the I/F clock and the MCLK, and outputs a frequency division ratio control signal based on the phase difference between the transfer clock and the I/F clock. The variable frequency divider 24c receives the MCLK and the frequency division ratio control signal, and performs frequency division on the MCLK (i.e., divides the frequency of the MCLK) in accordance with the frequency division ratio set based on the frequency division ratio control signal. Then, The variable frequency divider 24c outputs a sampling clock obtained by dividing the frequency of the MCLK. The frequency divider 24b divides the frequency of the sampling clock in accordance with its frequency division ratio, and outputs an I/F clock obtained by dividing the frequency of the sampling clock.

Figure 2:
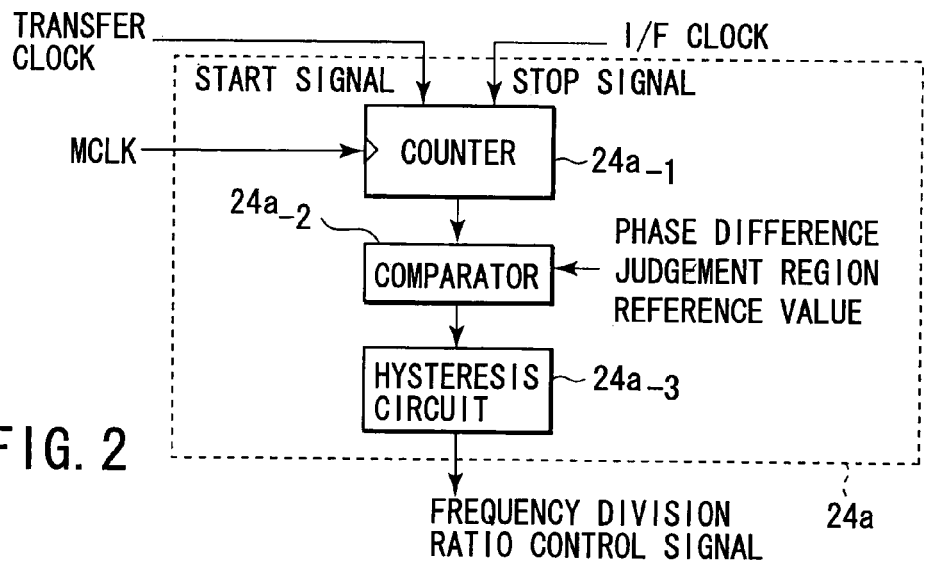
FIG. 2 is a block diagram of an example of the structure of a hysteresis phase comparator in the digital PLL in FIG. 1.

FIG. 2 shows an example of the structure of the hysteresis phase comparator 24a. The hysteresis phase comparator 24a comprises a counter $24a_{-1}$, a comparator $24a_{-2}$ and a hysteresis circuit $24a_{-3}$. The counter $24a_{-1}$ is a circuit for executing a counting operation, and detecting the phase difference between the transfer clock and the I/F clock. For example, the counter $24a_{-1}$ starts the counting operation in response to the rising edge (start signal) of the transfer clock, and stops the counting operation in response to the rising edge (stop signal) of the I/F clock. The count value of the counter $24a_{-1}$ is input to the comparator $24a_{-2}$. The comparator $24a_{\_2}$ compares the count value from the counter $24a_{\_1}$ with phase difference judgment region reference values. A result obtained by the above comparison is input to the hysteresis circuit $24a_{\_3}$. The hysteresis circuit $24a_{\_3}$ generates a control signal based on past operation hysteresis (which will be explained later) on the basis of the result of the comparison by the comparator $24a_{\_2}$. The hysteresis circuit $24a_{\_3}$ outputs the control signal to the outside (i.e., to the variable frequency divider 24c).

FIGS. 3A to 3E are views for use in explaining the operation of the hysteresis phase comparator 24a. FIGS. 3A, 3B, 3C, 3D and 3E show the transfer clock, second transfer data, MCLK, phase difference judgment region and phase difference judgment region reference value, respectively.

A period of the transfer clock, e.g., a rising edge period (from phase difference judgment region reference value "0" to phase difference judgment region reference value "12"), is divided into five periods. To the boundaries between the five periods, phase difference judgment region reference values ("2", "5", "7" and "10" in this case) are respectively assigned, which are obtained by standardizing the rising edge period in accordance with the periods of the MCLK. These reference values may be values which are fixed in accordance with the structure of the circuit, or values which are variable by a control signal or the like. In addition, the phase difference judgment region reference values shown in FIG. 3E are examples. That is, they can be set to desired values.

By using the phase difference judgment region reference values, four phase difference judgment regions, i.e., a normal operation region (N), a phase shift start judgment region (F), a phase shift start judgment region (R) and a phase shift end judgment region (E), are defined as shown in FIG. 3D.

As explained above, when the counter $24a_{\_1}$ determines a count value corresponding to the phase difference between the transfer clock and the I/F clock, the comparator $24a_{\_2}$ compares the count value with each of the phase difference judgment region reference values with respect to whether the count value is greater or smaller than each phase difference judgment region reference value. Based on the result of this comparison, a phase difference judgment region in which the rising edge (or falling edge) of the I/F clock is located is detected. When passing through the hysteresis circuit $24a_{\_3}$, the output of the comparator $24a_{\_2}$ is changed to a frequency division ratio control signal. The frequency division ratio control signal is output from the hysteresis comparator 24a to the variable frequency divider 24c.

The operation of the hysteresis operation of the digital PLL 24 according to the above embodiment will be explained by referring to the case of generating a control signal based on past operation hysteresis.

First of all, suppose that in the initial state, the rising edge (or falling edge) of the I/F clock is within the "normal operation region (N)" (see, e.g., FIGS. 4A to 4F). In this case, the hysteresis phase comparator 24a outputs a frequency division ratio control signal indicating "no phase shift". Thereby, in the variable frequency divider 24c, the frequency division ratio is set to "n". That is, the frequency (first frequency) of the sampling clock is 1/n of the MCLK. In this state, a PLL control is not applied. It corresponds to a state generally referred to as "VCO free-run".

Next, if the rising edge (or falling edge) of the I/F clock is located within the "phase shift start judgment region (F)" due to variation of the periods of the transfer clock or the like (see, e.g., FIGS. 5A to 5F), a frequency division control signal indicating "plus phase shift" is output from the hysteresis comparator 24a. Thereby, the frequency division ratio of the variable frequency divider 24c is set to "n+α (α>0)". That is, the frequency of the sampling clock (the second frequency lower than the first frequency by the fourth frequency) is 1/(n+α) of the frequency of the MCLK. As a result, the period of the I/F clock is multiplied by (n+α)/n. Thereby, the phase of the I/F clock is shifted such that the rising edge (or falling edge) gradually increasingly lags with respect to the rising edge (or falling edge) of the transfer clock.

On the other hand, when the rising edge (or falling edge) of the I/F clock is within the range of the "phase shift start judgment region (R)", a frequency division ratio control signal indicating "negative phase shift" is output from the hysteresis phase comparator 24a. Thereby, the frequency division ratio of the variable frequency divider 24c is set to "n−β(β>0)". That is, the frequency (the third frequency higher than the first frequency by the fifth frequency) of the sampling clock is 1/(n−β) of the frequency of the MCLK. As a result, the period of the I/F clock is multiplied by (n−β)/n. Thereby, the phase of the I/F clock is shifted such that the rising edge (or falling edge) gradually increasingly leads with respect to the rising edge (or falling edge) of the transfer clock.

Suppose the hysteresis phase comparator 24a once outputs a frequency division ratio control signal indicating "positive phase shift" or "negative phase shift". In this case, the hysteresis phase comparator 24a continues to output the above-frequency division ratio control signal until the rising edge (or falling edge) of the I/F clock falls within the "phase shift end judgment region (E)". In such a manner, the hysteresis phase comparator 24a is provided to have hysteresis characteristics and a dead zone indicated by the "normal operation region (N)".

The above frequency division ratio control signal indicating "no phase shift", "positive phase shift" or "negative phase shift" can be implemented with a two-bit digital signal. When the two-bit digital signal is applied to produce the frequency division ratio control signal, it can indicate "no phase shift", "positive phase shift" and "negative phase shift" with, e.g., "00", "01" and "10", respectively. In such a manner, the two-bit digital signal can serve as the frequency division ratio control signal. Needless to say, the frequency division ratio control signal is not limited to a two-bit digital signal. That is, any kind of signal may be used as the frequency division ratio control signal as long as it can distinguishably indicate the above three states. Also, the values of n, α and β may be values fixed in accordance with the structure of the circuit or values variable by a control signal or the like. However, the values of α and β are set such that the phase shift is greater than the maximum value of cycle to cycle jitter of the transfer clock.

Figure 6:
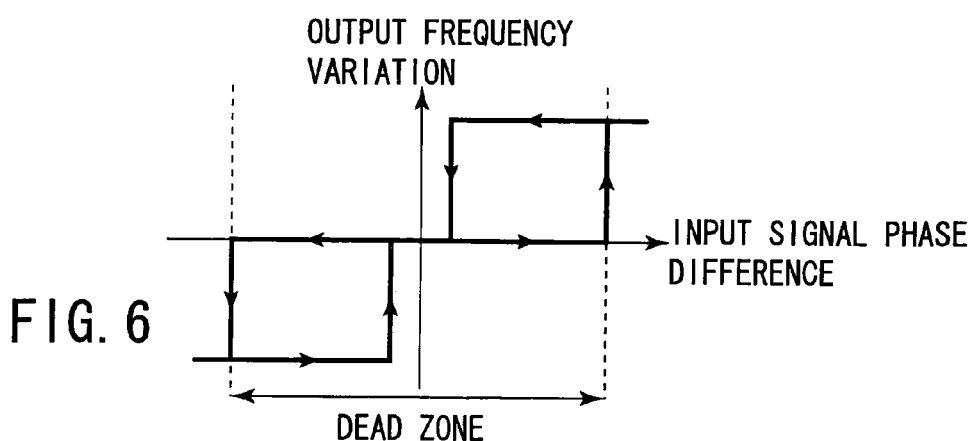
FIG. 6 is a view for showing an example of a relationship between the output frequency variation and input signal phase difference with respect to the hysteresis phase comparator.
Figure 13:
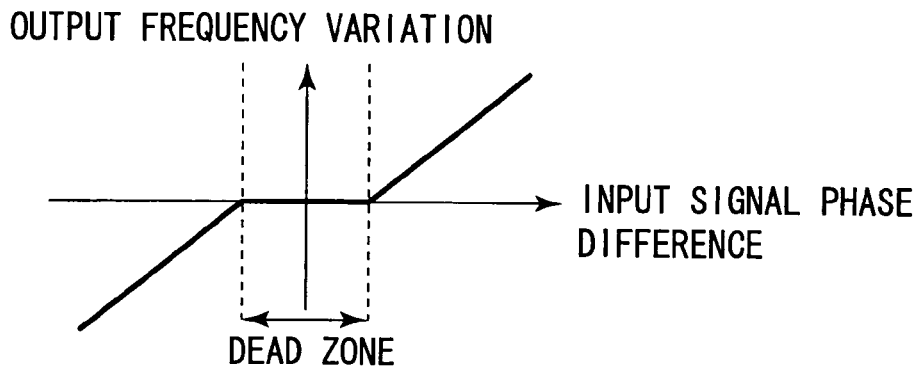
FIG. 13 is a view for showing a relationship between the output frequency variation and input signal phase difference with respect to a phase comparator shown in FIG. 9.
Figure 14:
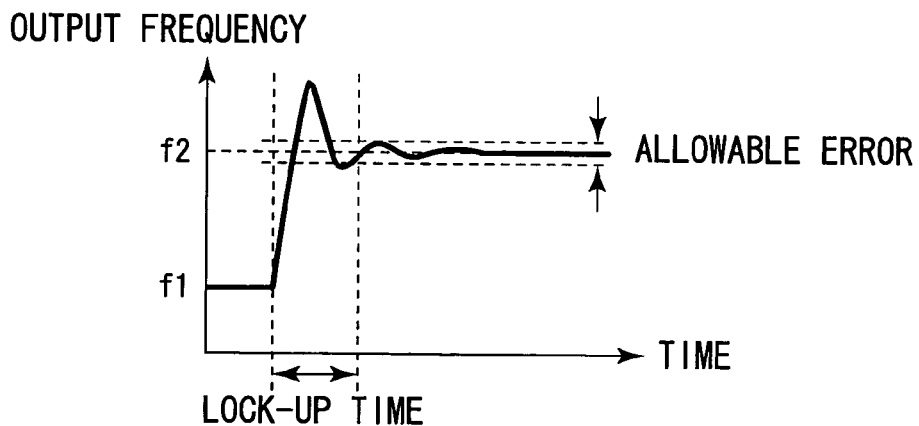
FIG. 14 is a waveform view for showing a case where a lock-up time is long with respect to the transient response characteristics of the conventional analog PLL.
Figure 15:
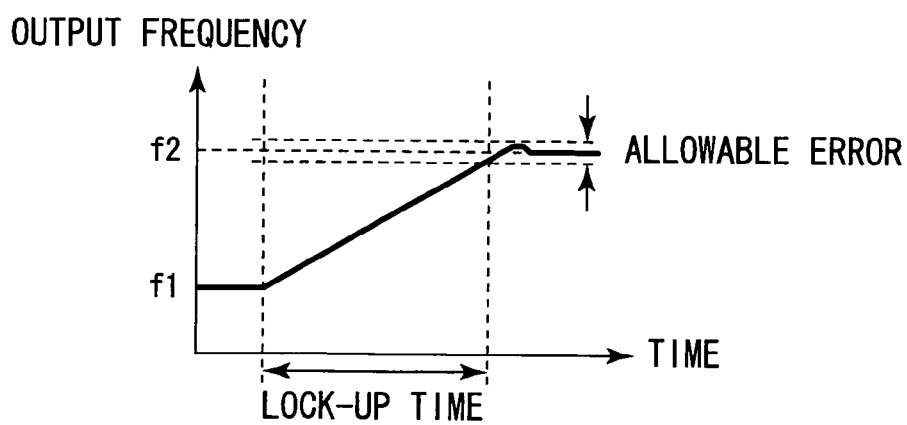
FIG. 15 is a waveform view for showing a case where the lock-up time is short with respect to the transient response characteristics of the conventional analog PLL.
Figure 16A:
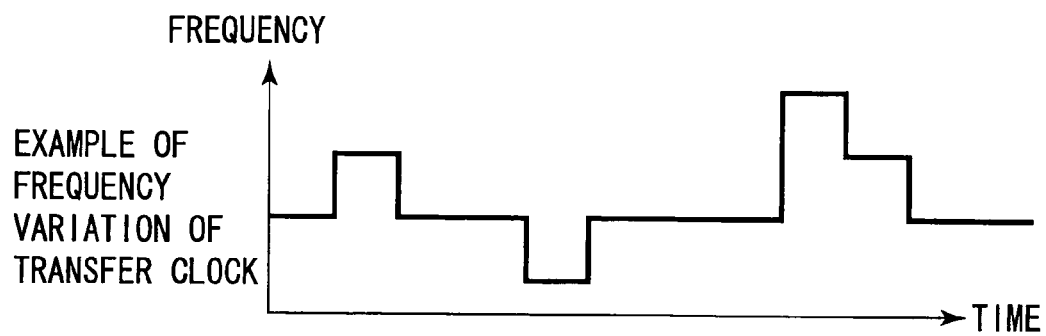
FIGS. 16A to 16C are waveform views for showing examples of the frequency variations of signals which occur when the conventional PLL operates.
Figure 16B:
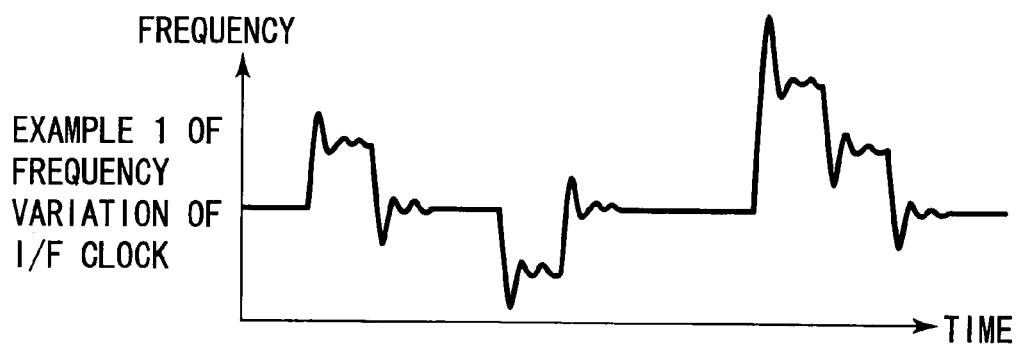
Figure 16C:
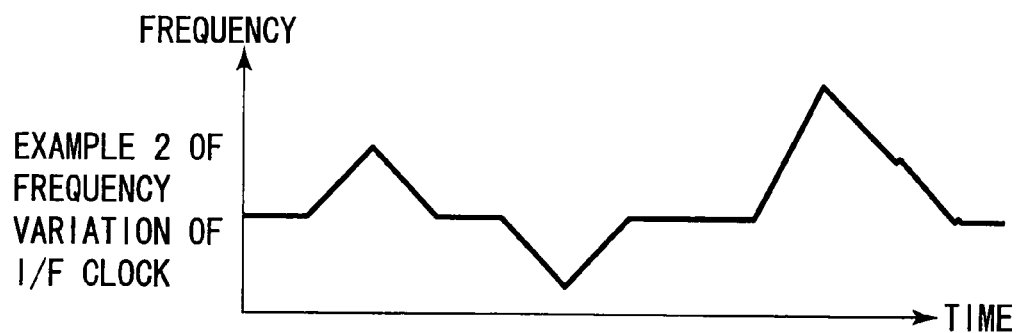

FIG. 6 discloses a relationship between the phase difference between the signals (transfer clock and I/F clock) input to the hysteresis phase comparator 24a in the digital PLL 24 according to the above embodiment of the present invention, and the variation of the frequency of the signal output from the digital PLL 24. This relationship corresponds to that in FIG. 13 (showing the prior art). As is clear from those figures, the hysteresis phase comparator 24a is greatly different from that in FIG. 13, and has hysteresis characteristics, and provide a wide dead zone.

Figure 7A:
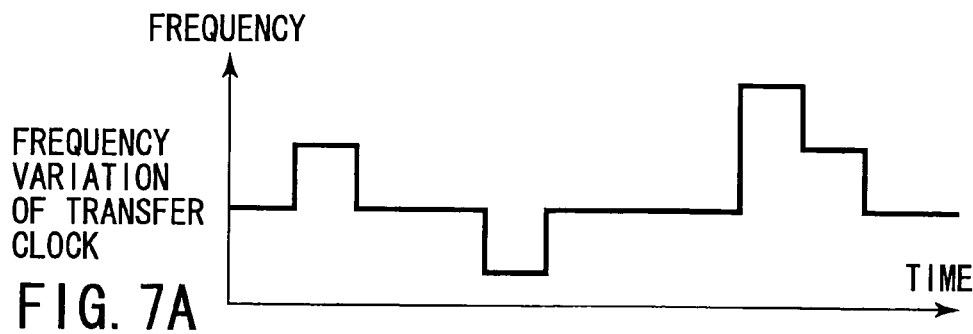
FIGS. 7A and 7B are waveform views for showing examples of the variation of the frequency of a signal which occurs when the digital PLL operates.
Figure 7B:
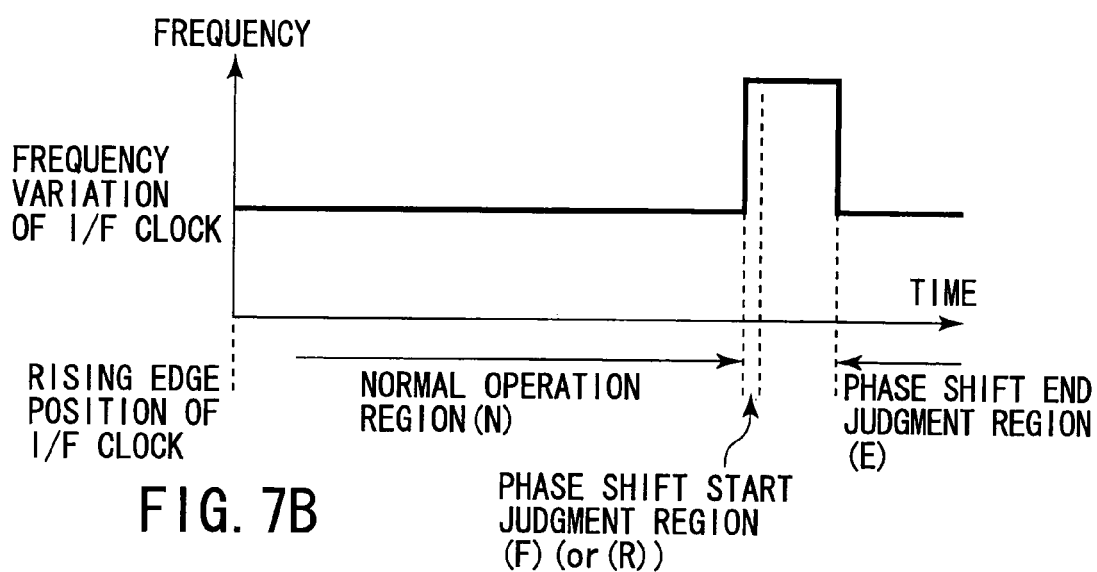

FIGS. 7A and 7B show an example of the frequency variation of the transfer clock and an example of the frequency variation of the I/F clock with respect to the frequency variation of the transfer clock, respectively, in the digital PLL 24 according to the embodiment of the present invention. As is clear from those figures, even if the frequency of the transfer clock varies, that of the I/F clock does not vary as long as the rising edge (or falling edge) of the I/F clock is within the "normal operation region (N)". When the frequency of the transfer clock greatly varies, the rising edge (or falling edge) of the I/F clock falls within the "phase shift start judgment region (F) (or (R))", and the phase of the I/F clock starts to shift. Then, the rising edge (or falling edge) of the I/F clock immediately shifts to exit the "phase shift start judgment region (F) (or (R))". However, until the rising edge (or falling edge) of the I/F clock falls within the "phase shift end judgment region (E)", the phase of the I/F clock continuously shifts, and thus the phase difference between the transfer clock and the I/F clock continuously varies. However, in this case, the frequency of the I/F clock is constant, since the frequency division ratio of the variable frequency divider 24c is constant. Then, when the rising edge (or falling edge) of the I/F clock falls within the "phase shift end judgment region (E)", the frequency of the I/F clock returns to that in a state "no phase shift".

When the phase shifts, the frequency division ratio of the variable frequency divider 24c varies only by a certain value ($\alpha$, $\beta$). Thus, at this time, the frequency is also a certain value (fmclk/(n+$\alpha$), fmclk/(n−$\beta$), where fmclk is the frequency of the MCLK. Therefore, while the phase is shifting, the frequencies of the I/F clock and sampling clock do not vary in accordance with the phase difference between the transfer clock and the I/F clock, unlike the conventional PLL circuit. Accordingly, the S/N ratio of the CODEC does not lower.

Further, the phase shift is set to be greater than the maximum value of the cycle to cycle jitter of the transfer clock. Thereby, while the phase is shifting, the rising edge (or falling edge) of the I/F clock necessarily shifts toward the "phase shift end judgment region (E)". Thus, the method according to the embodiment of the present invention can produce an I/F clock which reliably synchronizes with the second transfer data.

Furthermore, since the hysteresis phase comparator 24a has hysteresis characteristics, the dead zone can be set to be wide. In addition, the phase can also be continuously shifted until the time margin can be sufficiently ensured. Thus, once phase shifting ends, the time period required until phase shifting is needed again is long, and the number of times the phase shifts (the frequency variation) decreases, as compared with the conventional method employing a comparator which does not have hysteresis characteristics. This means that the jitter is small. That is, the method of the present invention can generate a clock signal in which the average value of jitter is smaller than that in the conventional method. As a result, the S/N ratio can be improved. Accordingly, the present invention is useful, especially for a system incorporating a CODEC for voice or audio.

Moreover, the digital PLL 24 according to the embodiment of the present invention can be implemented with a relatively simple logic circuit. Also, it can be easily designed.

The method for achieving the structure of the circuit (or the structure of the circuit) is not limited to that of the above embodiment shown in FIGS. 1 and 2, i.e., any method (any structure) may be applied as long as the same function can be achieved as in the embodiment of the present invention.

The above explanation of the embodiment of the present invention refers to the case where the invention is applied to the digital PLL. However, needless to say, the invention may be applied to the analog PLL.

For example, the counter $24a_{-1}$ may be formed to start the counting operation in response to the falling edge (start signal) of the transfer clock, and stop the counting operation in response to the falling edge (stop signal) of the I/F clock. Also, it may be formed to output, to the comparator $24a_{-2}$, a signal indicating the difference between a count value obtained at the timing of the rising edge (or falling edge) of the transfer clock and a count value obtained at the timing of the rising edge (or falling edge) of the I/F clock.

Additional advantages and modifications will readily occur to those skill in the art. Therefore, the invention in its broader aspects is not limited to the specific details and representative embodiments shown and described herein. Accordingly, various modifications may be made without departing from the sprit or scope of the general inventive concept as defined by the appended claims and their equivalents.

What is claimed is:

1. A synchronizing circuit comprising:
   a phase comparator having hysteresis characteristics and a dead zone, and configured to generate a frequency division ratio control signal based on a phase difference between a first clock and a second clock;
   a variable frequency divider configured to generate a fourth clock by subjecting a third clock to frequency division at a frequency division ratio set in accordance with the frequency division ratio control signal; and
   a clock generator configured to subject the fourth clock supplied from the variable frequency divider to frequency division at a predetermined frequency division ratio, and generate the second clock such that the second clock synchronizes with transfer data which is supplied from an outside of the synchronizing circuit,
   wherein the phase comparator comprises a counter configured to perform a counting operation by using the third clock, a comparator configured to compare a count output of the counter with phase difference judgment region reference values, and a hysteresis circuit configured to output the frequency division ratio control signal based on a result of comparison by the comparator.

2. The synchronizing circuit according to claim 1, wherein the first clock is a reference signal which synchronizes with the transfer data.

3. The synchronizing circuit according to claim 1, wherein the second clock is a signal which synchronizes with the first clock.

4. The synchronizing circuit according to claim 1, wherein the fourth clock is a signal having a frequency which is a rational number of times greater than that of the second clock.

5. The synchronizing circuit according to claim 1, wherein the hysteresis characteristics and a width of the dead zone of the phase comparator are determined in accordance with a structure of the synchronizing circuit.

6. The synchronizing circuit according to claim 1, wherein the hysteresis characteristics and a width of the dead zone of the phase comparator are arbitrarily set by a control signal.

7. The synchronizing circuit according to claim 1, wherein the count output of the counter is a difference between a count value obtained at a timing of one of a rising edge and a falling edge of the first clock and a count value obtained at a timing of one of a rising edge and a falling edge of the second clock.

8. The synchronizing circuit according to claim 1, wherein the counter starts to perform the counting operation at a timing of one of a rising edge and a falling edge of the first clock, and stops the counting operation at a timing of one of a rising edge and a falling edge of the second clock.

9. The synchronizing circuit according to claim 8, wherein the counter starts to perform the counting operation at the timing of said one of the rising edge and the falling edge of the first clock, and stops the counting operation at the timing of said one of the rising edge and the falling edge of the second clock, and the count output of the counter is a count value obtained by the counting operation.

10. The synchronizing circuit according to claim 1, wherein the comparator detects one of phase difference judgment regions, in which one of a rising edge and a falling edge of the second clock is located, on the basis of whether the count output is greater or smaller than each of the phase difference judgment region reference values associated with the phase difference judgment regions.

11. The synchronizing circuit according to claim 10, wherein the phase difference judgment regions are obtained by dividing a period of the first clock, and the phase difference judgment region reference values are obtained by standardizing the phase difference judgment regions in accordance with periods of the third clock.

12. The synchronizing circuit according to claim 1, wherein the hysteresis circuit generates a control signal based on past operation hysteresis, as the frequency division ratio control signal.

13. The synchronizing circuit according to claim 1, wherein on the basis of the result of the comparison by the comparator, the hysteresis circuit generates one of a control signal preventing a phase of the second clock from shifting, a control signal shifting the phase of the second clock such that one of a rising edge and a falling edge of the second clock gradually increasingly lags with respect to one of a rising edge and a falling edge of the first clock, and a control signal shifting the phase of the second clock such that one of the rising and falling edges of the second clock gradually increasingly leads with respect to one of the rising and falling edges of the first clock.

14. The synchronizing circuit according to claim 1, wherein the fourth clock has a frequency which is equal to one of the first frequency, a second frequency and a third frequency, the second frequency is higher than the first frequency by a fourth frequency, and the third frequency is lower than the first frequency by a fifth frequency.

15. The synchronizing circuit according to claim 1, wherein the fourth clock has a frequency which is equal to one of a first frequency, a second frequency and a third frequency, and the first frequency, the second frequency and third frequency are obtained by dividing a frequency of the third clock at a frequency division ratio.

* * * * *